(12) United States Patent
Kuang

(10) Patent No.: US 8,810,048 B2
(45) Date of Patent: Aug. 19, 2014

(54) 3D IC AND 3D CIS STRUCTURE

(71) Applicant: Taiwan Semiconductor Manufacturing Company, Ltd., Hsin-Chu (TW)

(72) Inventor: Hsun-Chung Kuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 58 days.

(21) Appl. No.: 13/622,894

(22) Filed: Sep. 19, 2012

(65) Prior Publication Data
US 2014/0077386 A1    Mar. 20, 2014

(51) Int. Cl.
*H01L 23/544*    (2006.01)
*H01L 27/088*    (2006.01)

(52) U.S. Cl.
CPC ............ *H01L 23/544* (2013.01); *H01L 27/088* (2013.01)
USPC ........... 257/797; 257/432; 257/447; 257/499; 257/774; 257/E23.179

(58) Field of Classification Search
CPC ............................ H01L 27/088; H01L 23/544
USPC .......... 438/538; 257/432, 447, 499, 774, 797, 257/E23.179
See application file for complete search history.

(56) References Cited

U.S. PATENT DOCUMENTS 7,545,045 B2 *    6/2009    Huang et al. ................... 257/774
2006/0249859 A1 *    11/2006    Eiles et al. ..................... 257/797

* cited by examiner

*Primary Examiner* — Long K Tran
(74) *Attorney, Agent, or Firm* — Slater and Matsil, L.L.P.

(57) ABSTRACT

An embodiment integrated circuit includes a first device supporting a first back end of line layer, the first back end of line layer including a first alignment marker, and a second device including a spin-on glass via and supporting a second back end of line layer, the second back end of line layer including a second alignment marker, the spin-on glass via permitting the second alignment marker to be aligned with the first alignment marker using ultraviolet light.

18 Claims, 4 Drawing Sheets

Hybid Bond/Anneal

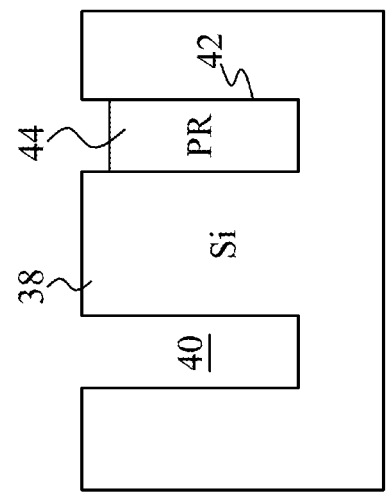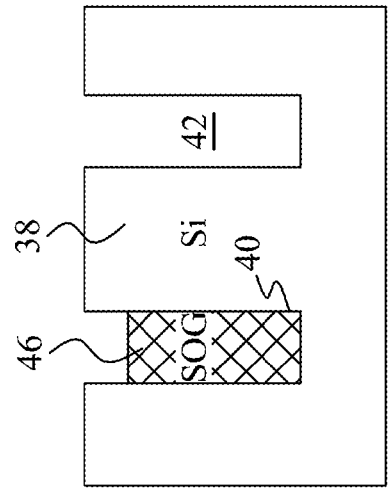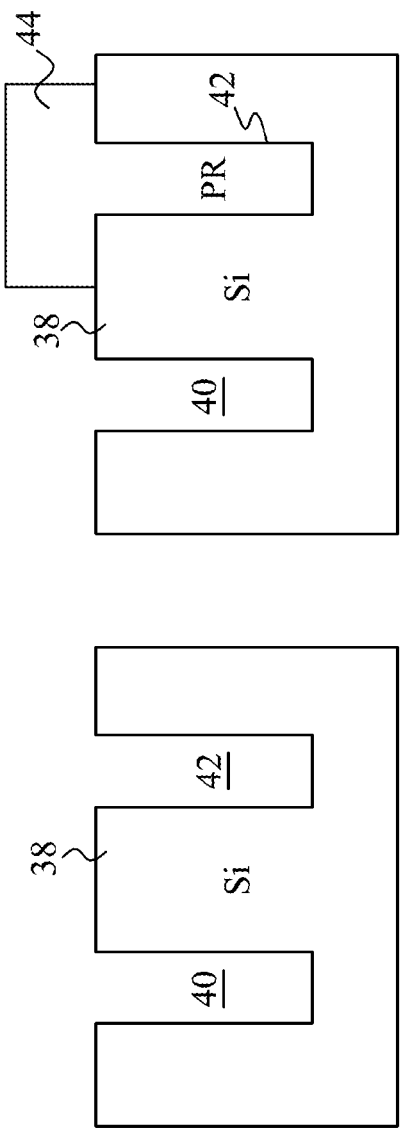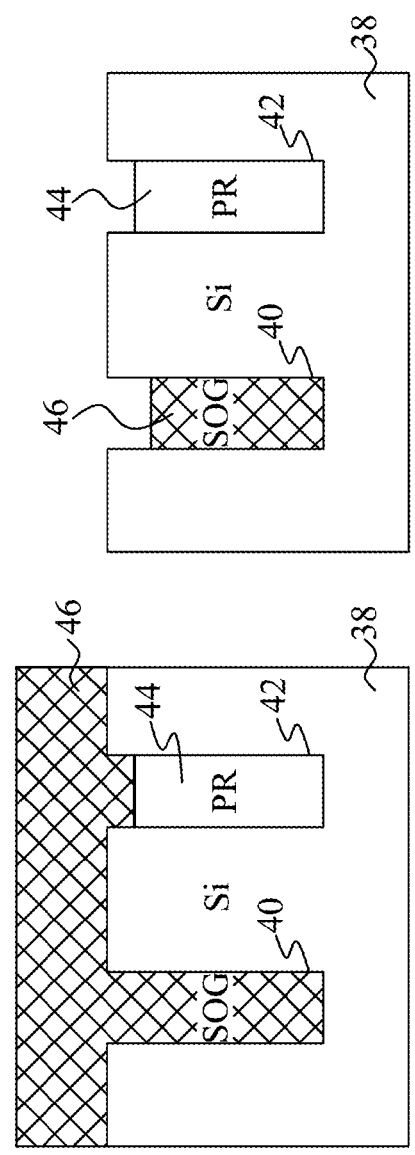

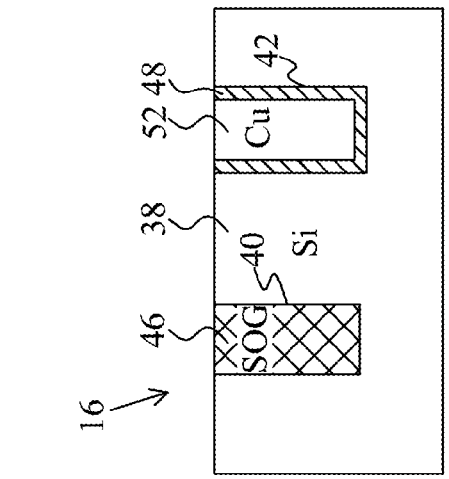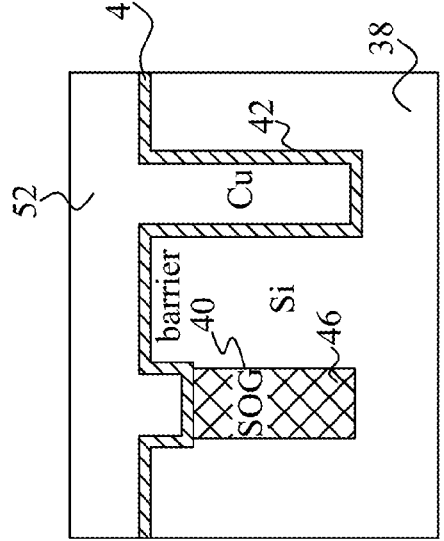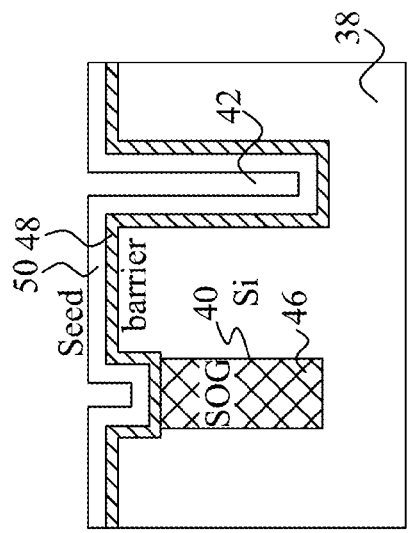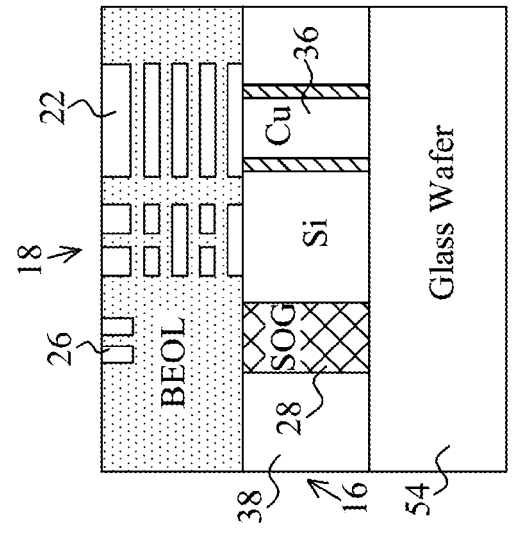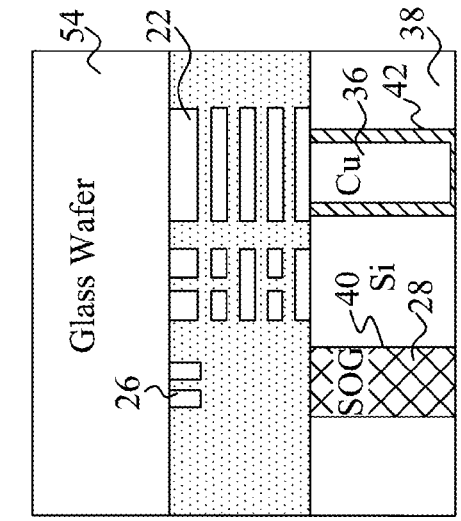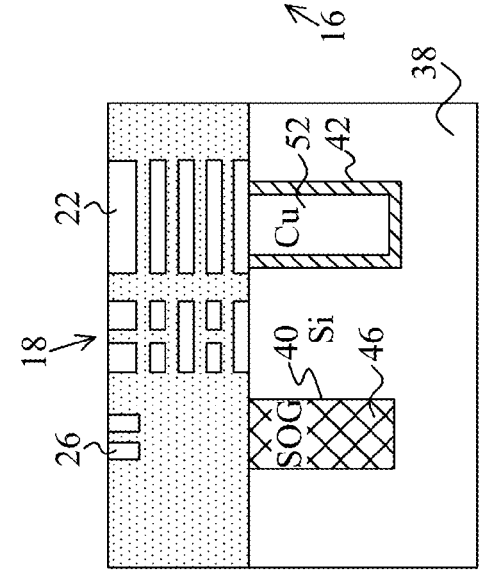

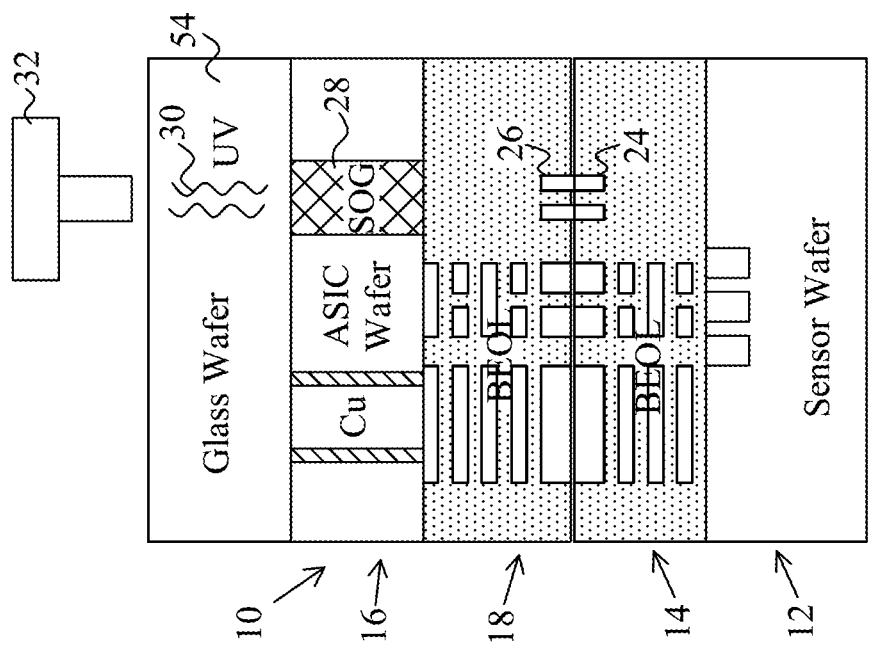
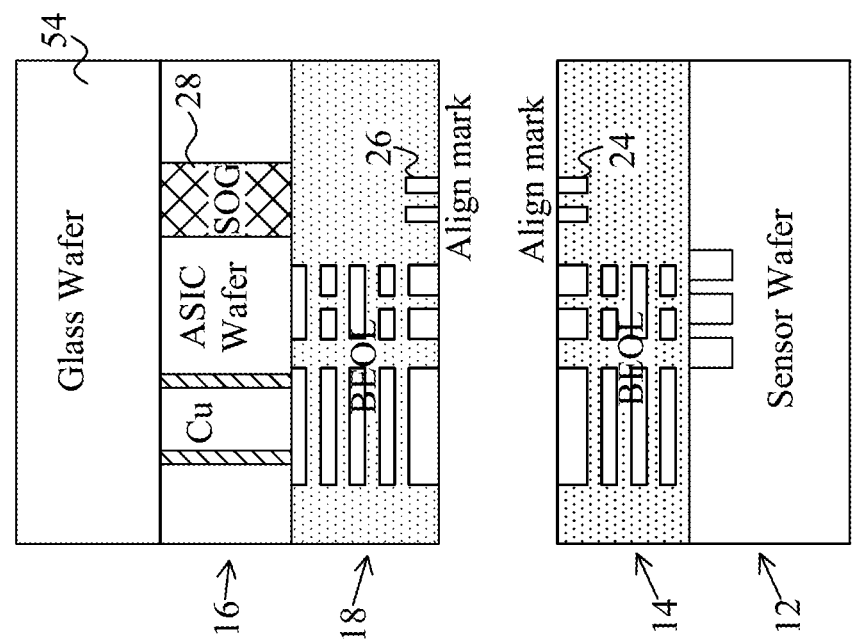

3D IC AND 3D CIS STRUCTURE

BACKGROUND

A complementary metal-oxide-semiconductor (CMOS) image sensor (CIS) generally utilizes a series of photodiodes formed within an array of pixel regions of a semiconductor substrate in order to sense when light has impacted the photodiode. Adjacent to each of the photodiodes within each of the pixel regions, a transfer transistor such as a field-effect transistor (FET) may be formed in order to transfer the signal generated by the sensed light within the photodiode at a desired time. Such photodiodes and transfer transistors allow for an image to be captured at a desired time by operating the transfer transistor at the desired time.

The conventional CIS may be formed in either a front side illumination (FSI) configuration or a back-side illumination (BSI) configuration. In either case, the CIS often includes one or more through silicon vias (TSVs) formed from, for example, copper (Cu). Unfortunately, these TSVs may generate high stress, which undesirably impacts the performance of the FET within the CIS.

In addition to the above, the process of manufacturing the conventional CIS device often includes aligning one device relative to another. The alignment process is typically performed using an infrared (IR) wavelength because silicon (Si) has a low transparency with short wavelengths.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 3a-3n collectively illustrate through cross sectional views a process of manufacturing the integrated circuit of FIG. 1.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a three dimensional (3D) integrated circuit or 3D complementary metal-oxide-semiconductor (CMOS) image sensor (CIS). The concepts in the disclosure may also apply, however, to other integrated circuits or semiconductor devices.

Figure 1:
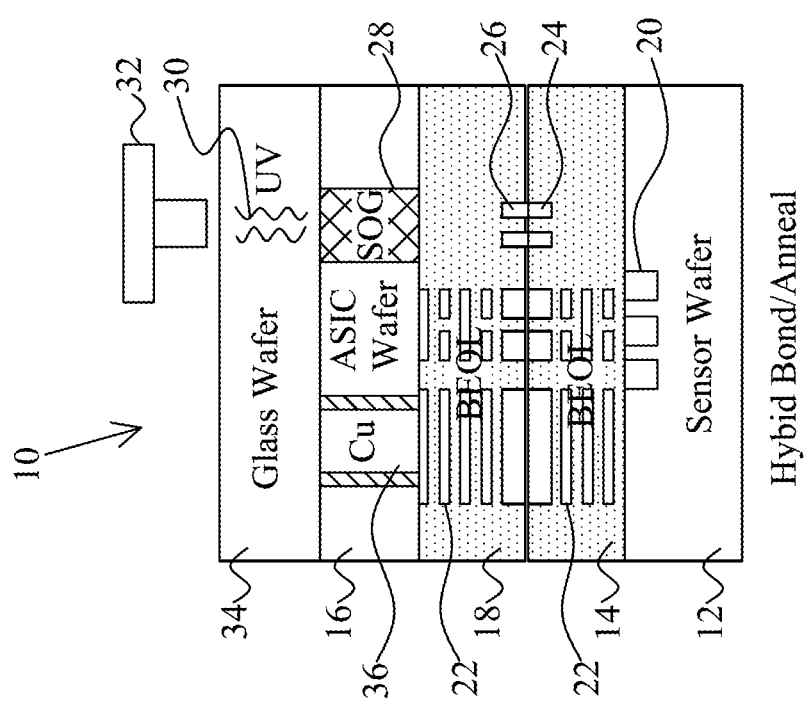
FIG. 1 illustrates an embodiment integrated circuit employing a spin-on glass via to align first and second alignment markers.

Referring now to FIG. 1, an embodiment integrated circuit 10 is illustrated. The integrated circuit 10 includes a first wafer 12, a first back end of line layer 14, a second wafer 16, and a second back end of line layer 18. In an embodiment, the first wafer 12 is a sensor wafer that includes, for example, a plurality of photodiodes 20. In an embodiment, the first wafer 12 is an application specific integrated circuit (ASIC). It should be appreciated that other components or devices may also be included or incorporated in the first wafer 12. However, these have been omitted from the drawing for ease of illustration.

As shown in FIG. 1, the first wafer 12 supports the first back end of line layer 14. In an embodiment, the first back end of line layer 14 is formed upon the first wafer 12. As shown, the first back end of line layer 14 includes various metallization 22. It should be appreciated that the first back end of line layer 14 may also include contacts, insulating layers (i.e., dielectrics), metal levels, and bonding sites, and so on. However, these have been omitted from the drawing for ease of illustration.

Still referring to FIG. 1, the first back end of line layer 14 also includes a first alignment marker 24. In an embodiment, the first alignment marker 24 is formed from the same metal used in the metallization 22 in the first back end of line layer 14. While the first alignment marker 24 is formed from two spaced-apart portions of metal in FIG. 1, the first alignment marker 24 may be otherwise formed in other embodiments. In an embodiment, the first alignment marker 24 may be a mark or structure on the first back end of line layer 14.

As shown in FIG. 1, the second wafer 16 supports the second back end of line layer 18. In an embodiment, the second back end of line layer 18 is formed upon the second wafer 16. As shown, the second back end of line layer 18 includes various metallization 22. It should be appreciated that the second back end of line layer 18 may also include contacts, insulating layers (i.e., dielectrics), metal levels, and bonding sites, and so on. However, these have been omitted from the drawing for ease of illustration.

Still referring to FIG. 1, the second back end of line layer 18 also includes a second alignment marker 26. In an embodiment, the second alignment marker 26 is formed from the same metal used in the metallization 22 in the second back end of line layer 18. While the second alignment marker 26 is formed from two spaced-apart portions of metal in FIG. 1, the second alignment marker 26 may be otherwise formed in other embodiments. In an embodiment, the second alignment marker 26 may be a mark or structure on the second back end of line layer 18.

In an embodiment, the second wafer 16 is an application specific integrated circuit (ASIC) wafer including, for example, various devices (e.g., transistors, capacitors, resistors, etc.). It should be appreciated that other components or devices may also be included or incorporated in the second wafer 16. However, these have been omitted from the drawing for ease of illustration.

As shown in FIG. 1, in an embodiment the second wafer 16 includes a spin-on glass via 28. The spin-on glass via 28 is generally vertically aligned with each of the first and second alignment markers 24, 26. In addition, the spin-on glass via is generally horizontally offset from the metallization 22 other than the first alignment marker 24 in the first back end of line layer 14 and the second alignment marker 26 in the second back end of line layer 18. The spin-on glass via 28 and the second alignment marker 26 are spaced apart by a portion of the second back end of line layer 18.

The spin-on glass via 28 permits the second alignment marker 26 to be aligned with the first alignment marker 24 using ultraviolet light 30. In other words, the second alignment marker 26 may be aligned with the first alignment marker 24 when the ultraviolet light 30 is passed through the spin-on glass via 28. In an embodiment, the spin-on glass via 28 permits the second alignment marker 26 to be aligned with the first alignment marker within about 0.1 μm using the ultraviolet light 30. Such alignment accuracy is not possible with infrared (IR) light due to the longer wavelength of infrared light. As shown in FIG. 1, the ultraviolet light 30 may be provided by a light source 32 and may propagate through a glass carrier wafer 34 temporarily mounted to the second wafer 16.

In an embodiment, the second wafer 16 includes at least one through silicon via (TSV) 36. In an embodiment, the through silicon via 36 is formed from copper or other suitable conductive metal. As shown in FIG. 1, the copper-filled through silicon via 36 is horizontally adjacent to the spin-on glass via 28 in the second wafer 16. The copper-filled through silicon via 36 generally passes entirely through the second wafer 16. As such, the copper-filled through silicon via 36 may be used to electrically connect devices or components found on opposing sides of the second wafer 16.

Figure 2:
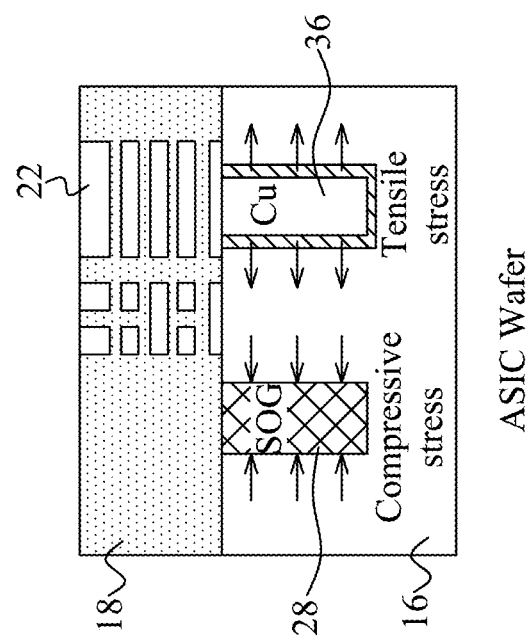
FIG. 2 illustrates a compressive stress induced by the spin-on glass via in the integrated circuit of FIG. 1.

Referring now to FIG. 2, in an embodiment the spin-on glass via 28 generates compressive stress in the second wafer 16. This is in contrast to the tensile stress generated by the horizontally adjacent copper-filled through silicon via 36 in the second wafer 16. Therefore, stress induced in the second wafer 16 by the copper-filled through silicon via 36 may be reduced or counteracted by the spin-on glass via 28. This allows the performance of semiconductor devices in the second wafer 16 such as, for example, field-effect transistors (FETs), to be controlled.

Referring collectively to FIGS. 3a-3n, an embodiment process of manufacturing the integrated circuit 10 of FIG. 1 is illustrated. In FIG. 3a, a substrate 38 (e.g., a silicon substrate) is etched to form first and second recesses 40, 42. In FIG. 3b, a photo resist 44 is formed over a portion of the substrate 38 and in the second recess 42. Thereafter, in FIG. 3c, the photo resist 44 is etched back. Next, in FIG. 3d, a spin-on glass coating 46 is formed over the substrate 38, inside the first recess 40, and over the remaining photo resist 44 occupying the second recess 42. In FIG. 3e, the spin-on glass coating 46 is etched back.

Referring now to FIG. 3f, the photo resist 44 from FIG. 3e has been removed and an annealing process is performed on the spin-on glass coating 46 remaining in the first recess 40. Next, in FIG. 3g, a copper barrier 48 and a seed layer 50 are formed over the spin-on glass coating 46 remaining in the first recess 40, over the substrate 38, and in the second recess 42. In FIG. 3h, a copper coating 52 is formed over and merges with the seed layer 50 through an electrochemical plating (ECP) process. As shown, a portion of the copper coating 52 and a portion of the copper barrier 48 occupies the second recess 42.

Moving to FIG. 3i, a chemical mechanical planarization (CMP) process is performed to remove portions of the substrate 38, copper barrier 48, spin-on glass coating 46, and copper coating 52. As shown, the process provides a generally planar surface for the second wafer 16. Next, in FIG. 3j, back end of line (BEOL) processing is performed to form the second back end of line layer 18 over the second wafer 16. In an embodiment, the back end of line processing is employed to form the second alignment marker 26. The second alignment markers 26 may be formed using other processes and at other points in the process in other embodiments.

Referring now to FIG. 3k, a glass carrier wafer 54 is mounted to a frontside of the second back end of line layer 18 and a silicon wafer thinning process is performed. As shown in FIG. 3k, the silicon wafer process at least partially defines the spin-on glass via 28 and the copper-filled through silicon via 36. Thereafter, in FIG. 3l, the glass carrier wafer 54 is removed from the frontside of the second back end of line layer 18 and mounted to the backside of the second wafer 16.

Next, in FIG. 3m, the device (e.g., the second wafer 16, the second back end of line layer 18, and the glass carrier wafer 54) is flipped such that the second alignment marker 26 is facing the first alignment marker 24 on the first back end of line layer 14 formed over the first wafer 12. In FIG. 3n, the ultraviolet light 30 generated by the light source 32 propagates through the glass carrier wafer 54 and the spin-on glass via 28 such that the first and second alignment markers 24, 26 may be suitably aligned using the ultraviolet light 30. Upon alignment of the first and second alignment markers 24, 26, a hybrid bond process and an anneal process may be performed to bond the first and second back end of line layers 14, 18 together. Thereafter, the glass carrier wafer 54 may be removed and the integrated circuit 10 used.

An embodiment integrated circuit includes a first device supporting a first back end of line layer, the first back end of line layer including a first alignment marker, and a second device including a spin-on glass via and supporting a second back end of line layer, the second back end of line layer including a second alignment marker, the spin-on glass via permitting the second alignment marker to be aligned with the first alignment marker using ultraviolet light.

A embodiment three dimensional integrated circuit includes a sensor device, a first back end of line layer formed on the sensor device, the first back end of line layer including a first alignment marker, an application specific circuit device including a spin-on glass via, and a second back end of line layer formed on the application specific circuit device, the second back end of line layer including a second alignment marker, the second alignment marker configured to be aligned with the first alignment marker when ultraviolet light is passed through the spin-on glass.

An embodiment method of forming an integrated circuit includes forming a first device, forming a first back end of line layer over the first device, the first back end of line layer including a first alignment marker, forming a second device with a spin-on glass via, forming a second back end of line layer over the second device, the second back end of line layer including a second alignment marker, and passing ultraviolet light through the spin-on glass via to align the first alignment marker with the second alignment marker.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:
1. An integrated circuit, comprising:
a first device supporting a first back end of line layer, the first back end of line layer including a first alignment marker; and
a second device including a spin-on glass via and supporting a second back end of line layer, the second back end of line layer including a second alignment marker, the spin-on glass via permitting the second alignment marker to be aligned with the first alignment marker using ultraviolet light;
wherein the spin-on glass via vertically aligned with each of the first and second alignment markers.

2. The integrated circuit of claim 1, wherein the spin-on glass via permits the second alignment marker to be aligned with the first alignment marker within about 0.1 μm using the ultraviolet light.

3. The integrated circuit of claim 1, wherein the spin-on glass via is horizontally offset from metallization other than the first alignment marker in the first back end of line layer and the second alignment marker in the second back end of line layer.

4. The integrated circuit of claim 1, wherein the spin-on glass via and the second alignment marker are spaced apart by a portion of the second back end of line layer.

5. The integrated circuit of claim 1, wherein the spin-on glass via generates compressive stress in the second device.

6. The integrated circuit of claim 1, wherein the second device includes at least one copper-filled through silicon via (TSV) horizontally adjacent to the spin-on glass via.

7. The integrated circuit of claim 1, wherein the first alignment marker contacts the second alignment marker.

8. The integrated circuit of claim 1, wherein the first back end of line layer abuts the second back end of line layer.

9. The integrated circuit of claim 1, wherein the first device is one of a complementary metal-oxide-semiconductor (CMOS) image sensor (CIS) and an application specific integrated circuit (ASIC).

10. The integrated circuit of claim 1, wherein the second device is an application specific integrated circuit (ASIC).

11. A three dimensional integrated circuit, comprising:
  a sensor device;
  a first back end of line layer formed on the sensor device, the first back end of line layer including a first alignment marker;
  an application specific circuit device including a spin-on glass via; and
  a second back end of line layer formed on the application specific circuit device, the second back end of line layer including a second alignment marker, the second alignment marker configured to be aligned with the first alignment marker when ultraviolet light is passed through the spin-on glass via;
  wherein the spin-on glass via vertically aligned with each of the first and second alignment markers.

12. The integrated circuit of claim 11, wherein the spin-on glass via permits the second alignment marker to be aligned with the first alignment marker within about 0.1 μm using the ultraviolet light.

13. The integrated circuit of claim 11, wherein the spin-on glass via generates compressive stress in the application specific circuit device.

14. An integrated circuit, comprising:
  a first device supporting a first back end of line layer, the first back end of line layer including a first alignment marker, the first alignment marker comprising laterally spaced apart from the first back end of line layer; and
  a second device including a spin-on glass via and supporting a second back end of line layer, the second back end of line layer including a second alignment marker, the second alignment marker laterally spaced apart from the second back end of line layer, the spin-on glass via generating a compressive stress in the second device and vertically aligned with each of the first alignment marker and the second alignment marker, the first alignment marker vertically aligned within 0.1 μm of the second alignment marker.

15. The integrated circuit of claim 14, wherein the spin-on glass via is vertically spaced apart from the second alignment marker by a portion of the second back end of line layer.

16. The integrated circuit of claim 14, wherein a bottom surface of the spin-on glass via abuts the second back end of line layer.

17. The integrated circuit of claim 14, wherein the spin-on glass via is oriented within the second device such that an ultraviolet light propagating through the spin-on glass via encounters the first alignment marker and the second alignment marker.

18. The integrated circuit of claim 14, wherein the first alignment marker and the second alignment marker are formed from metal, and the first device is a complementary metal-oxide-semiconductor (CMOS) image sensor (CIS) and the second device is an application specific integrated circuit (ASIC).

* * * * *